(12) United States Patent
Hong et al.

(10) Patent No.: US 7,078,804 B2
(45) Date of Patent: Jul. 18, 2006

(54) MICRO-ELECTRO-MECHANICAL SYSTEM (MEMS) PACKAGE WITH SIDE SEALING MEMBER AND METHOD OF MANUFACTURING THE SAME

(75) Inventors: Suk-Kee Hong, Seoul (KR); Yeong-Gyu Lee, Kyunggi-do (KR); Heung-Woo Park, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 4 days.

(21) Appl. No.: 10/952,253

(22) Filed: Sep. 28, 2004

(65) Prior Publication Data
US 2005/0258516 A1  Nov. 24, 2005

(30) Foreign Application Priority Data
May 19, 2004  (KR) .................. 10-2004-0035634

(51) Int. Cl.
*H01L 23/04* (2006.01)
*H01L 23/06* (2006.01)
*H01L 23/02* (2006.01)
*H01L 29/22* (2006.01)

(52) U.S. Cl. .............. 257/730; 257/729; 257/680; 257/99

(58) Field of Classification Search .......... None
See application file for complete search history.

(56) References Cited

U.S. PATENT DOCUMENTS

| 6,303,986 | B1 | 10/2001 | Shook |
| 6,400,009 | B1* | 6/2002 | Bishop et al. ............ 257/704 |
| 6,822,326 | B1* | 11/2004 | Enquist et al. ........... 257/729 |
| 6,962,834 | B1* | 11/2005 | Stark ...................... 438/107 |
| 2005/0157374 | A1* | 7/2005 | Tarn ....................... 359/291 |

* cited by examiner

*Primary Examiner*—Nathan J. Flynn
*Assistant Examiner*—Victor A. Mandala, Jr.
(74) *Attorney, Agent, or Firm*—Christensen O'Connor Johnson Kindness PLLC

(57) ABSTRACT

A micro-electro-mechanical system (MEMS) package with a side sealing member and a method of manufacturing the package are disclosed. In the MEMS package and method of the present invention, a sealing member is formed on a side surface of a lid glass that is mounted on a spacer surrounding MEMS elements provided on a base substrate and covers the MEMS elements, so that the sealing member hermetically seals the MEMS elements from the external environment.

6 Claims, 5 Drawing Sheets

MICRO-ELECTRO-MECHANICAL SYSTEM (MEMS) PACKAGE WITH SIDE SEALING MEMBER AND METHOD OF MANUFACTURING THE SAME

BACKGROUND OF THE INVENTION

1. Field of the Invention

The present invention relates, in general, to micro-electro-mechanical system (MEMS) packages with side sealing members and methods of manufacturing the packages and, more particularly, to an MEMS package and a method of manufacturing the package, in which a sealing member is formed on a side surface of a lid glass that is mounted on a spacer surrounding MEMS elements provided on a base substrate and covers the MEMS elements, so that the sealing member hermetically seals the MEMS elements from the external environment.

2. Description of the Related Art

In recent years, high-capacity communications for broadband service, such as in the Internet or the IMT 2000, have become powerful, so that optical communication technique including, for example, WDM (wavelength division multiplexing), has been quickly standardized. In relation to the standardization of the optical communication technique, MEMS, which does not depend on wavelength, data rate or signal format and thereby has characteristics of being "optically transparent", has been proposed and recognized as an innovative technique to supplant electronics, which can accomplish the recent trend of system smallness.

In the related art, current applications of MEMS are accelerometers, pressure sensors, inkjet heads, hard disk heads, projection displays, scanners and micro-fluidics. In recent years, interest in the technique of optical communication elements with higher operational performances to meet the rapid development in the optical communications field has increased.

Particularly, the interest in the technique of the optical communication elements is concentrated to spatial light modulators, which have a great number of micromirrors and operate in a specified switching manner that the micromirrors are actuated by MEMS type actuators. The spatial light modulators use an optical signal processing technique with advantages in that a great amount of data can be quickly processed in a parallel manner, unlike a conventional digital information processing technique, in which a great amount of data cannot be processed in real time.

Thus, studies have been actively conducted on the design and production of binary phase only filters, optical logic gates, light amplifiers, image processing techniques, optical devices, and light modulators using the spatial light modulation theory. Of them, the spatial light modulators are applied to optical memories, optical display devices, printers, optical interconnections, and hologram fields, and studies have been conducted to develop display devices employing the spatial display modulators.

However, the MEMS elements have ultra-fine actuators so that the MEMS elements are greatly sensitive to the external environment, including temperature, humidity, micro-dust, vibration and impact, and thereby may frequently commit errors during operation or suddenly stop operation.

In an effort to allow the MEMS elements to effectively operate without being negatively affected by the environment, the MEMS elements have been sealed in cavities of sealed packages. U.S. Pat. No. 6,303,986 discloses a method and apparatus for sealing MEMS elements using a hermetic lid to provide an MEMS package.

Herein below, the construction of the MEMS package disclosed in U.S. Pat. No. 6,303,986, in which the lid glass hermetically seals the MEMS elements from the external environment, will be described with reference to FIG. 1.

FIG. 1 shows a representative sectional view of the MEMS package in which the transparent lid hermetically seals the MEMS element. As shown in FIG. 1, a conductive ribbon 100 having a metallic conductive/reflective covering 102 is formed over an upper surface of a semiconductor substrate 104, with an air gap 106 defined between the ribbon 100 and the substrate 104.

A conductive electrode 108 is formed on the upper surface of the substrate 104 and covered with an insulation layer 110. The conductive electrode 108 is placed under the ribbon 100 at a position under the air gap 106.

The conductive/reflective covering 102 extends beyond the region of the mechanically active ribbon 100 and is configured as a bond pad 112 at its distal end. The MEMS package is also passivated with a conventional overlying insulating passivation layer 114 which does not cover the bond pads 112 or the ribbon structures 100 and 102.

Control and power signals are coupled to the MEMS package using conventional wire-bonding structures 116.

Unlike conventional semiconductor manufacturing techniques in which semiconductor elements are packed densely onto the upper surface of a semiconductor substrate, an optical glass is hermetically sealed directly onto the semiconductor substrate in the above-mentioned US patent. Thus, the bond pads 112 are spaced a considerable distance from the ribbon structures 100 and 102, so that a lid sealing region 118 is provided. A solderable material 120 is formed onto the lid sealing region 118.

The hermetic lid 122, which is joined to the semiconductor substrate, is preferably formed of an optical quality material. Thus, the lid 122 can be used for a variety of purposes including filtering undesired radiation, enhancing reflectivity, or decreasing reflectivity.

The lid 122 may be also coated with an optically sensitive material to be used for other purposes without being limited to the above-mentioned purposes.

Once the lid 122 is formed to a size appropriate to fit concurrently over the lid sealing region 118, with a solderable material 124 formed in a ring surrounding the periphery of one surface of the lid 122, solder 126 is deposited onto the solderable material 124 so that the lid 122 is joined to the semiconductor substrate.

Though not shown to scale in the drawing, a significant space exists between the lid 122 and the ribbon structures 100 and 102 to prevent them from interfering with one another. Thus, the ribbon structures 100 and 102 are free to move upwards and downwards.

FIG. 2 shows a plan view of an exemplary package disclosed in the above-mentioned US patent wherein various regions are shown as blocks. As shown in the drawing, the ribbon structures of a GLV (diffraction grating light valve) to be used as a display engine comprise a mechanically active region 140, while the lid sealing region 118 surrounds the mechanically active region 140.

In this case, the lid sealing region 118 is passivated and includes no mechanically active elements, such as those traditionally found in MEMS devices.

Furthermore, the lid sealing region 118 includes no bond pads where other off-chip interface structures, such as the lid 122, would interfere with the effective operation of the MEMS device. However, it is possible that the lid sealing region 118 could include active electronic elements. In the event that the lid sealing region 118 did include active electronic elements, effort must be taken to planarize that region in order to provide the surface to which the lid 122 can properly mate.

The bonding region 142 surrounds the lid sealing region 118, and includes several bond pads 114 necessary for making interconnection from the package to off-chip circuits and systems.

Herein below, the method of sealing a hermetic lid to a semiconductor substrate to provide an MEMS package will be described in detail with reference to FIGS. 3a and 3b.

As shown in FIG. 3a, a first solderable material 150 is formed onto the lid sealing region 152 of the semiconductor substrate 154. A second solderable material 156 is also formed around the peripheral edges of the transparent lid 158. Thereafter, a layer of solder 160 is formed over the layer of second solderable material 156.

The transparent lid 158 is brought into contact with and aligned to the semiconductor substrate 154 to provide an assembly. Heat is applied to the assembly, thus allowing the solder 160 to be melted.

In that case, surface tension of the melted solder 160' causes the solder 160' to remain between the first solderable material 150 on the semiconductor substrate 154 and the second solderable material 156 on the transparent lid 158.

Thereafter, the assembly is heated for a sufficient time to allow the solder 160' to flow and wet all solderable surfaces. Once the heat is removed, the solder 160' is re-solidified and the transparent lid 158 is hermetically sealed to the semiconductor substrate 154 as shown in FIG. 3b.

However, in the above-mentioned method of sealing the semiconductor elements in the MEMS package, the solder must be placed between the substrate and the lid and, thereafter, heat must be applied to the solder through a reflow process at a predetermined temperature so as to bond the lid to the substrate. Thus, the method undesirably reduces the work speed to cause a reduction in productivity.

Another problem of the above-mentioned method is that it is impossible to execute a reworking process, such as for adding solder, even when the sealing is not complete due to inaccurate positioning of the solder and/or application of a deficient amount of solder to the junction between the substrate and the lid.

SUMMARY OF THE INVENTION

Accordingly, the present invention has been made keeping in mind the above problems occurring in the related art, and an object of the present invention is to provide an MEMS package and a method of manufacturing the package, in which a sealing member is formed on a side surface of a lid glass that is mounted on a spacer surrounding MEMS elements provided on a base substrate and covers the MEMS elements, so that the sealing member hermetically seals the MEMS elements from the external environment.

In order to achieve the above object, according to one aspect of the present invention, there is provided a micro-electro-mechanical system (MEMS) package with a side sealing member, comprising: a base substrate provided with an MEMS element thereon; a first metal layer provided through patterning on the base substrate while surrounding the MEMS element; and a spacer mounted to the base substrate while being in contact with the first metal layer, thus securing an MEMS moving space where the MEMS element is free to move vertically; a lid glass provided with a second metal layer for uniting a sealing member to the lid glass, the second metal layer being provided at a predetermined portion at which the lid glass is in contact with the spacer when the lid glass is mounted to the spacer; and the sealing member provided on the first metal layer, the spacer and an outside surface of the second metal layer of the lid glass.

According to another aspect of the present invention, there is provided a method of manufacturing a micro-electro-mechanical system (MEMS) package with a side sealing member, comprising: providing an MEMS element on a base substrate; patterning a first metal layer on the base substrate so that the first metal layer surrounds the MEMS element; mounting a spacer to the base substrate so that the spacer is in contact with the first metal layer, thus securing an MEMS moving space where the MEMS element is free to move vertically; mounting a lid glass to the spacer, the lid glass having a second metal layer at a predetermined portion thereof at which the lid glass is in contact with the spacer when the lid glass is mounted to the spacer; and applying a sealing member on the first metal layer, the spacer and an outside surface of the second metal layer of the lid glass, thus hermetically sealing the MEMS element from an external environment.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
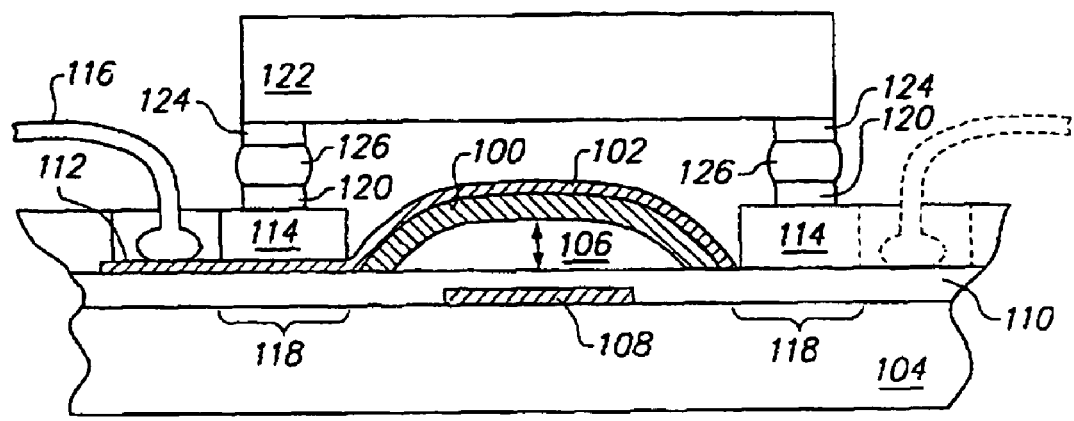
FIG. 1 is a sectional view illustrating the construction of a conventional MEMS package.
Figure 2:
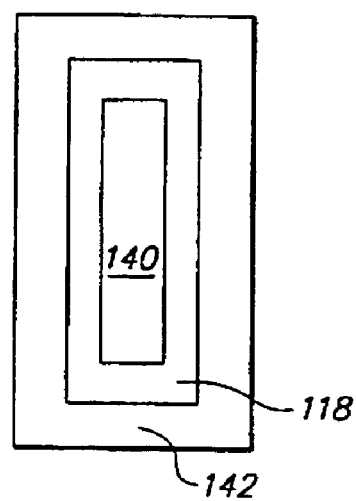
FIG. 2 is a plan view of an embodiment of the package of FIG. 1.
Figure 3A:
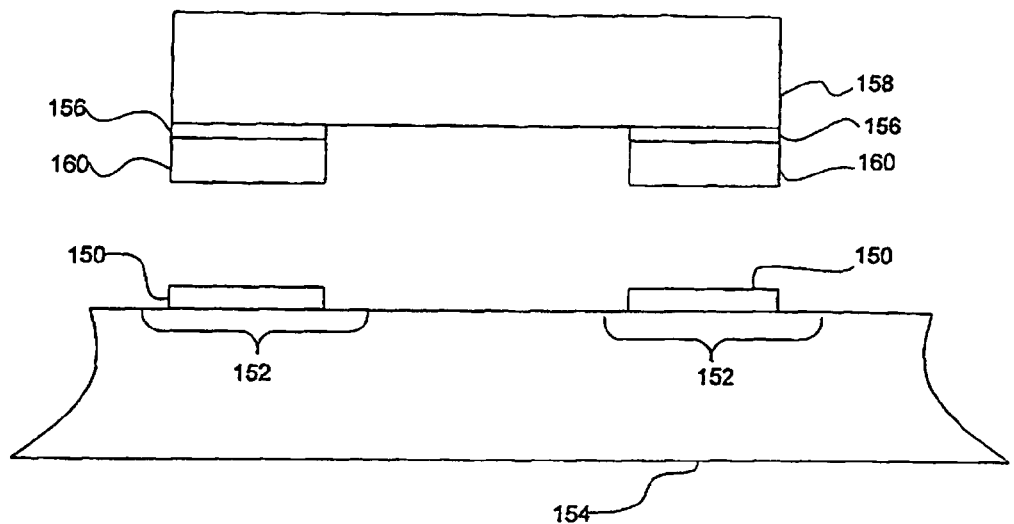
FIGS. 3a and 3b are views illustrating a process of sealing a hermetic lid to a semiconductor substrate to provide the package of FIG. 1.
Figure 3B:
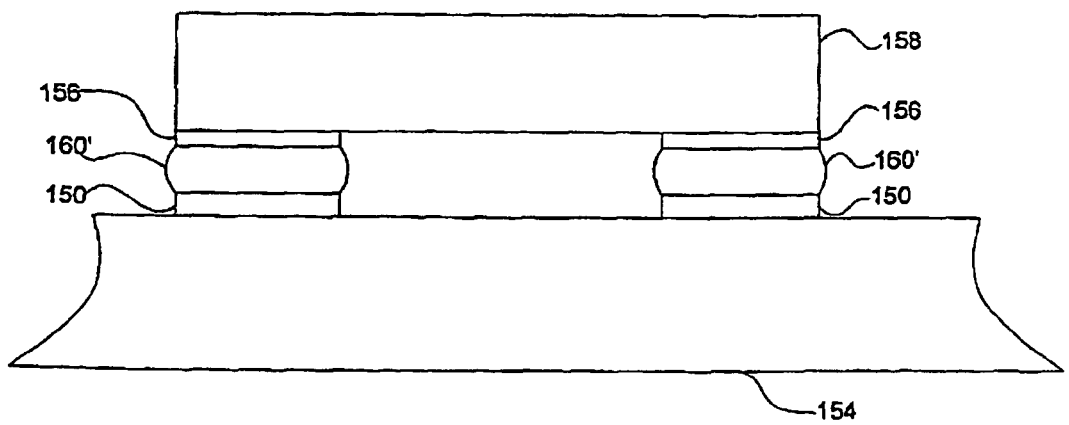
Figure 4:
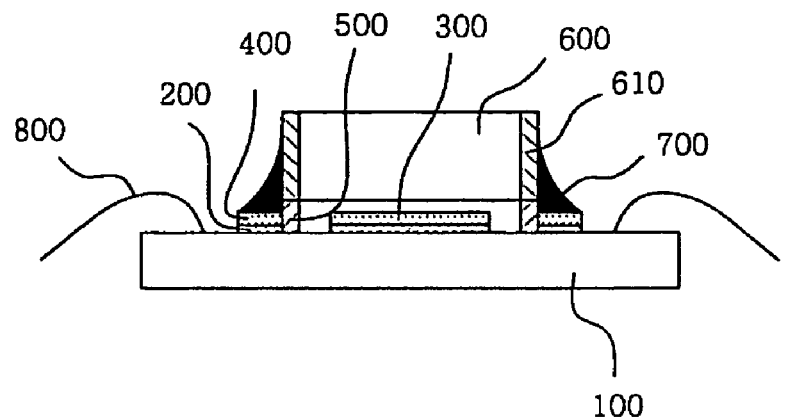
FIG. 4 is a sectional view of an MEMS package with a side sealing member according to an embodiment of the present invention.

Herein below, an MEMS package with a side sealing member and a method of manufacturing the MEMS package according to the present invention will be described in detail with reference to the accompanying drawings, FIGS. 4 through 5h.

First, the construction of the MEMS package with the side sealing member according to an embodiment of the present invention will be described in detail in conjunction with FIG. 4.

In the present invention, the MEMS package is configured such that a side sealing member is formed on a side surface of a lid glass that covers MEMS elements provided on a base substrate, so that the sealing member hermetically seals the MEMS elements from the external environment. As shown in FIG. 4, the MEMS package according to the present invention comprises a base substrate 100 on which MEMS elements 300 are provided, an insulating passivation layer 200, a first metal layer 400, a spacer 500, a lid glass 600 and a side sealing member 700.

The base substrate 100 may be a semiconductor substrate on which the MEMS elements 300 are formed, or a conventional PCB (printed circuit board) on which the MEMS elements 300 are bonded through die-bonding so that the PCB serves as an element carrier. The base substrate 100 is provided with bond pads (not shown) to which wires 800 are connected so as to transceive electric signals with an external circuit.

In that case, examples of the MEMS elements 300 are diffractive, reflective or transmissive light modulating elements, optical elements or display elements used in a variety of optical devices, such as optical memories, optical displays, printers, optical interconnections, and hologram displays.

The insulating passivation layer 200, which is formed on the upper surface of the base substrate 100, is a protective layer made of an insulating material, such as $SiO_2$ or $SiN_x$. Thus, the insulating passivation layer 200 protects the base substrate 100 from damage during continued processes and functions to prevent the MEMS elements 300 from being short-circuited to the base substrate 100.

The first metal layer 400 is formed on the passivation layer 200 of the base substrate 100 by patterning a conductive metal through a sputtering or metalorganic chemical vapor deposition (MOCVD) process so that the first metal layer 400 surrounds the MEMS elements 300.

In that case, the first metal layer 400 serves as a joining layer through which the sealing member 700 is easily united to the base substrate 100.

The spacer 500 is mounted to the base substrate 100 such that a side surface of the spacer 500 is in contact with the first metal layer 400 that is formed by patterning to surround the MEMS elements 300. The spacer 500 provides an MEMS moving space above a predetermined region of the base substrate 100, so that the MEMS elements 300 provided on the base substrate 100 are free to move vertically in the MEMS moving space.

The spacer 500 also functions as a lid glass carrier through which the lid glass 600 to cover the MEMS elements 300 on the substrate 100 is mounted to the base substrate 100. In that case, the spacer 500 is united with the lid glass 600 through a second metal layer 610 formed on the lid glass 600.

The spacer 500 is preferably made of metal, epoxy resin, plastic or glass.

The lid glass 600 is mounted to the top end of the spacer 500 so as to cover the MEMS elements 300 on the base substrate 100, thus protecting the MEMS elements 300 from the external environment, including humidity and dust. In the present invention, the lid glass 600 is provided on a spacer aligning part thereof with the second metal layer 610 which enhances the joining force of the lid glass 600 to the sealing member 700.

The lid glass 600 may be coated on one or both sides thereof with an antireflective (AR) coating so that incident light transmissibility of the lid glass 600 can be enhanced.

The sealing member 700 hermetically seals the MEMS elements 300 provided on the base substrate 100 from the external environment. The sealing member 700 is applied to a space which is defined by the first metal layer 400 on the base substrate 100, an outside surface of the spacer 500 and an outside surface of the second metal layer 610 of the lid glass 600 mounted to the spacer 500.

In a detailed description, the sealing member 700 made of a sealing material, such as solder or an epoxy resin, is bonded to the upper surface of the first metal layer 400, the spacer 500 and the outside surface of the second metal layer 610 of the lid glass 600 through a preform process, a laser process or a reflow process. Thus, the sealing member 700 hermetically seals the MEMS elements 300 from the external environment.

In the preform process, previously prepared solder having a predetermined shape is mounted to the space between the first metal layer 400, the outside surface of the spacer 500 and a passivation region formed by the outside surface of the second metal layer 610 of the glass lid 600 mounted to the spacer 500, thus providing the sealing member 700. In the laser process, solder is supplied through a solder supplier to the space between the first metal layer 400, the outside surface of the spacer 500 and the passivation region formed by the outside surface of the second metal layer 610 of the glass lid 600 and is, thereafter, fused by a laser beam to be united to the space, thus providing the sealing member 700. In the reflow process, solder is supplied to the space between the first metal layer 400, the outside surface of the spacer 500 and the passivation region formed by the outside surface of the second metal layer 610 of the glass lid 600 in the same manner as described above, and is, thereafter, heated to be fused and united to the space, thus providing the sealing member 700.

In that case, the sealing member 700 preferably has a sealing level of $10^{-7}$ Mg or higher to desirably seal the MEMS elements 300 from the external environment.

Herein below, the method of manufacturing the MEMS package with the side sealing member according to the present invention will be described with reference to FIGS. 5a through 5h.

Figure 5A:
FIGS. 5a through 5h are views illustrating a process of manufacturing the MEMS package with the side sealing member according to the present invention.
Figure 5B:

First, an insulating passivation layer 200 is formed on the upper surface of a base substrate 100 as shown in FIGS. 5a and 5b before MEMS elements 300 are provided on the base substrate 100.

In that case, the base substrate 100 may be a semiconductor substrate on which the MEMS elements 300 are formed, or a conventional PCB on which the MEMS elements 300 are bonded through die-bonding so that the PCB serves as an element carrier.

Furthermore, the insulating passivation layer 200, which is formed on the upper surface of the base substrate 100, is a protective layer made of an insulating material, such as $SiO_2$ or $SiN_x$, so that the insulating passivation layer 200 protects the base substrate 100 from damage during continued processes and functions to prevent the MEMS elements 300 from being short-circuited to the base substrate 100.

Figure 5C:
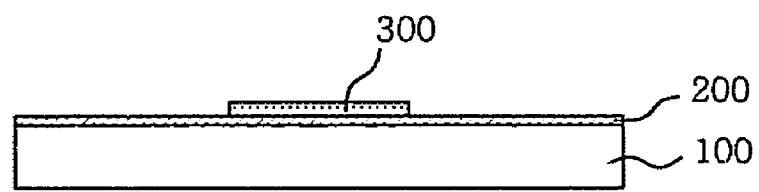

After the insulating passivation layer 200 is formed on the upper surface of the base substrate 100 as described above, the MEMS elements 300 are provided on the base substrate 100 with the passivation layer 200 interposed between the base substrate 100 and the MEMS elements 300 as shown in FIG. 5c.

In that case, the MEMS elements 300 may be diffractive, reflective or transmissive light modulating elements, optical elements or display elements used in a variety of optical devices, such as optical memories, optical displays, printers, optical interconnections, and hologram displays.

The MEMS elements 300 may be formed on the base substrate 100 so that the elements 300 are integrated with the substrate 100. Alternatively, the MEMS elements 300 may be produced separately from the base substrate 100 prior to being mounted to the upper surface of the base substrate 100.

Figure 5D:
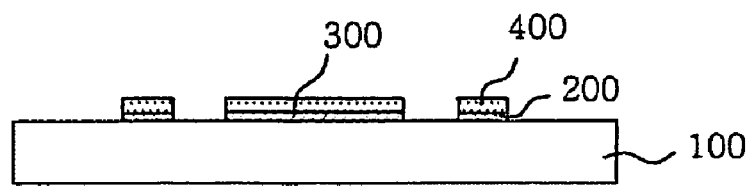

After the MEMS elements 300 are provided on the base substrate 100 with the insulating passivation layer 200 interposed between the substrate 100 and the elements 300 as described above, a first metal layer 400 having a predetermined shape to mount a sealing member 700 to the base substrate 100 is formed on the substrate 100 as shown in FIG. 5d.

In that case, the first metal layer 400 is formed through a metallization process to surround the MEMS elements 300 on the base substrate 100 while being spaced apart from the elements 300, and serves as a joining layer through which the sealing member 700 is easily united to the base substrate 100.

Figure 5E:
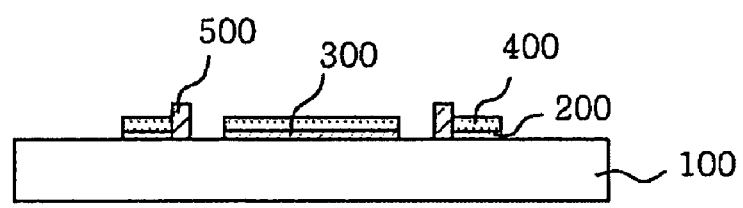
Figure 5F:
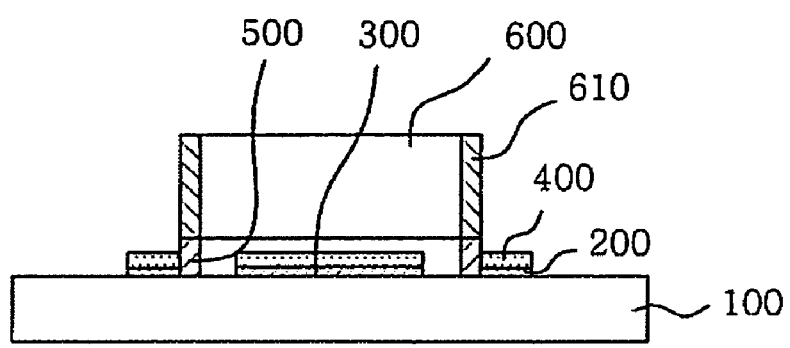

After the first metal layer 400 is formed on the base substrate 100 as described above, a spacer 500 is mounted to the base substrate 100 so as to secure an MEMS moving space where the MEMS elements 300 are free to move vertically as shown in FIG. 5e.

In that case, the spacer 500 is mounted to the upper surface of the base substrate 100 such that a side surface of the spacer 500 is in contact with the first metal layer 400 that is formed by patterning to surround the MEMS elements 300. The spacer 500 provides the MEMS moving space above a predetermined region of the base substrate 100, so that the MEMS elements 300 on the base substrate 100 are free to move vertically in the MEMS moving space.

At this time, the spacer 500 is made of metal, epoxy resin, plastic or glass and has a height to sufficiently provide the MEMS moving space where the MEMS elements 300 of the base substrate 100 freely move vertically.

Furthermore, the spacer 500 functions to mount a lid glass 600 to the base substrate 100 so that the lid glass 600 covers the MEMS elements 300 on the base substrate 100. In that case, the spacer 500 is united to the lid glass 600 through a second metal layer 610 provided on the lid glass 600.

After the spacer 500 is mounted to the base substrate 100 as described above, the lid glass 600 is mounted to the top end of the spacer 500 so as to cover the MEMS elements 300 on the base substrate 100, thus protecting the MEMS elements 300 from the external environment, including humidity and dust. In the present invention, the lid glass 600 is provided on a spacer aligning part thereof with the second metal layer 610 which enhances a joining force of the lid glass 600 to the sealing member 700.

The lid glass 600 may be coated on one or both sides thereof with an antireflective (AR) coating so that incident light transmissibility of the lid glass 600 can be enhanced.

Figure 5G:
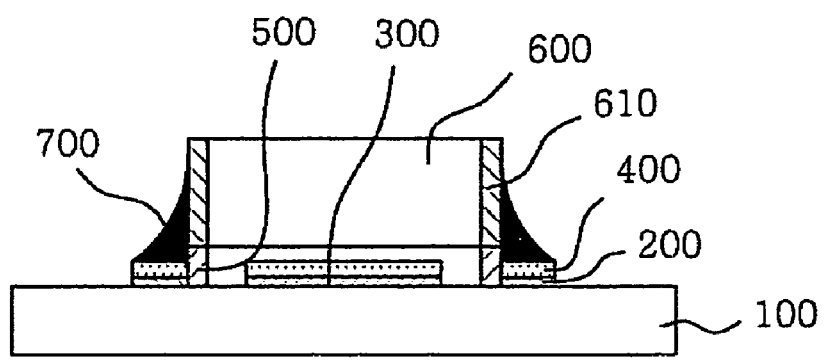
Figure 5H:
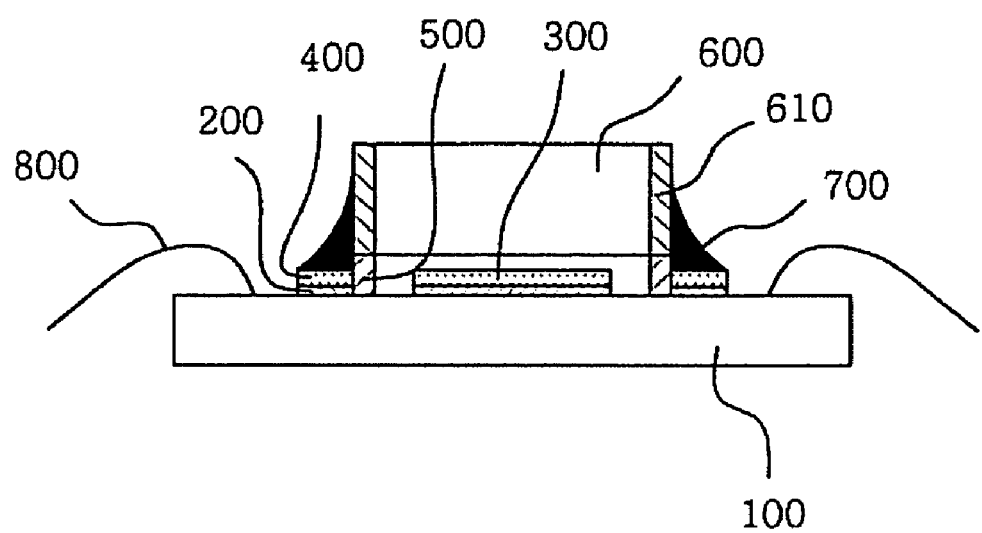

After the lid glass 600 is mounted to the spacer 500 through the second metal layer 610 as described above, the side sealing member 700 to hermetically seal the MEMS elements 300 provided on the base substrate 100 from the external environment is provided as shown in FIG. 5g.

In that case, the sealing member 700 is formed by uniting, through a preform process, a laser process or a reflow process, a sealing material, such as solder or an epoxy resin, to a space between the upper surface of the first metal layer 400 on the base substrate 100, the outside surface of the spacer 500 and the outside surface of the second metal layer 610 of the lid glass 600 mounted to the spacer 500. Thus, the sealing member 700 hermetically seals the MEMS elements 300 on the base substrate 100 from the external environment.

Thereafter, wires 800 are connected through wire-bonding to bond pads (not shown) provided on predetermined positions of the base substrate 100 which are electrically coupled to the MEMS elements 300. Thus, the MEMS package with the side sealing member of the present invention, in which signals from the MEMS elements 300 are transmitted to an external circuit through the wires 600, is produced as shown in FIG. 5h.

As is apparent from the above description, the MEMS package and method of manufacturing the package according to the present invention hermetically and reliably seals MEMS elements from the external environment, including temperature, humidity, impact and vibration, by a side sealing member which is formed on a side surface of a lid glass that covers the MEMS elements.

Furthermore, as soldering is executed to the side surface of the lid glass which covers the MEMS elements, the present invention simplifies the process of manufacturing the MEMS package and allows a reworking process, such as for adding solder, to be executed when the sealing is not complete due to inaccurate positioning of the solder and/or application of a deficient amount of solder.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A micro-electro-mechanical system (MEMS) package with a side sealing member, comprising:
   a base substrate provided with an MEMS element thereon;
   a first metal layer provided through patterning on the base substrate while surrounding the MEMS element; and
   a spacer mounted to the base substrate while being in contact with the first metal layer, thus securing an MEMS moving space where the MEMS element is free to move vertically;
   a lid glass provided with a second metal layer for uniting a sealing member to the lid glass, the second metal layer being provided at a predetermined portion at which the lid glass is in contact with the spacer when the lid glass is mounted to the spacer; and
   the sealing member provided on the first metal layer, the spacer and an outside surface of the second metal layer of the lid glass.

2. The MEMS package as set forth in claim 1, further comprising:
   a passivation layer provided between the base substrate and the first metal layer so as to prevent the MEMS element from being short-circuited to the base substrate.

3. The MEMS package as set forth in claim 1, wherein the lid glass is coated on at least one side thereof with an antireflective (AR) coating so as to enhance incident light transmissibility thereof.

4. The MEMS package as set forth in claim 1, wherein the sealing member comprises solder or an epoxy resin.

5. A method of manufacturing a micro-electro-mechanical system (MEMS) package with a side sealing member, comprising:
   providing an MEMS element on a base substrate;
   patterning a first metal layer on the base substrate so that the first metal layer surrounds the MEMS element;
   mounting a spacer to the base substrate so that the spacer is in contact with the first metal layer, thus securing an MEMS moving space where the MEMS element is free to move vertically;
   mounting a lid glass to the spacer, the lid glass having a second metal layer at a predetermined portion thereof at which the lid glass is in contact with the spacer when the lid glass is mounted to the spacer; and applying a sealing member on the first metal layer, the spacer and an outside surface of the second metal layer of the lid glass, thus hermetically sealing the MEMS element from an external environment.

6. The method as set forth in claim 5, further comprising:

providing a passivation layer on the base substrate so as to prevent the MEMS element from being short-circuited to the base substrate.

* * * * *

UNITED STATES PATENT AND TRADEMARK OFFICE
CERTIFICATE OF CORRECTION

| | |
|---|---|
| PATENT NO. | : 7,078,804 B2 |
| APPLICATION NO. | : 10/952253 |
| DATED | : July 18, 2006 |
| INVENTOR(S) | : S.-K. Hong et al. |

Page 1 of 1

It is certified that error appears in the above-identified patent and that said Letters Patent is hereby corrected as shown below:

| COLUMN | LINE | ERROR |
|---|---|---|
| (30) Foreign Application Priority Data | 1 | "10-2004-0035634" should read --2004-35634-- |

Signed and Sealed this

Second Day of January, 2007

JON W. DUDAS
*Director of the United States Patent and Trademark Office*